United States Patent
Cho

(10) Patent No.: US 7,480,321 B2
(45) Date of Patent: Jan. 20, 2009

(54) VERTICAL EXTERNAL CAVITY SURFACE EMITTING LASER (VECSEL) HAVING MODULATING MIRROR AND DISPLAY APPARATUS EMPLOYING THE SAME

(75) Inventor: Soo-haeng Cho, Suwon-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 0 days.

(21) Appl. No.: 11/513,208

(22) Filed: Aug. 31, 2006

(65) Prior Publication Data
US 2007/0171951 A1 Jul. 26, 2007

(30) Foreign Application Priority Data
Jan. 25, 2006 (KR) .............. 10-2006-0007907

(51) Int. Cl.
*H01S 3/081* (2006.01)
(52) U.S. Cl. ............... 372/50.124; 372/10; 372/15; 372/22; 372/99
(58) Field of Classification Search .............. 372/15, 372/50.124, 22, 10, 99
See application file for complete search history.

(56) References Cited

U.S. PATENT DOCUMENTS

| 3,426,294 A * | 2/1969 | Koester ............ 372/15 |
|---|---|---|
| 5,043,992 A * | 8/1991 | Royer et al. ............ 372/34 |
| 6,128,131 A * | 10/2000 | Tang ............ 359/443 |
| 6,764,183 B2 * | 7/2004 | Okazaki ............ 353/31 |
| 6,897,992 B2 * | 5/2005 | Kikuchi ............ 359/237 |
| 2005/0226304 A1 * | 10/2005 | Schwarz et al. ............ 372/98 |
| 2005/0243875 A1 * | 11/2005 | Le et al. ............ 372/20 |

* cited by examiner

Primary Examiner—Minsun Harvey
Assistant Examiner—Michael Carter
(74) Attorney, Agent, or Firm—Buchanan Ingersoll & Rooney PC

(57) ABSTRACT

A vertical external cavity surface emitting laser (VECSEL) having an improved mirror that forms an external cavity to modulate an emitted laser beam and display apparatus employing the same are provided. The VECSEL includes: a pumping light source; a laser chip that is excited by a pump beam emitted by the pumping light source to emit a laser beam of a predetermined wavelength; a folding mirror that is separated from the laser chip and is obliquely disposed relative to an axis of incident light emitted by the laser chip and converts the propagation path of an incident laser beam; a movable mirror unit facing the folding mirror and rotates so as to selectively reflect a laser beam reflected from the folding mirror to the folding mirror. The display apparatus includes: the VECSEL having the above-mentioned structure; a light scanning unit scanning light emitted by the VECSEL to create a planar image onto the screen; and a projection optical system that is disposed between the VECSEL and the screen and enlarges and projects a laser beam onto the screen.

13 Claims, 6 Drawing Sheets

VERTICAL EXTERNAL CAVITY SURFACE EMITTING LASER (VECSEL) HAVING MODULATING MIRROR AND DISPLAY APPARATUS EMPLOYING THE SAME

CROSS-REFERENCE TO RELATED PATENT APPLICATION

This application claims the benefit of Korean Patent Application No. 10-2006-0007907, filed on Jan. 25, 2006, in the Korean Intellectual Property Office, the disclosure of which is incorporated herein in its entirety by reference.

BACKGROUND OF THE DISCLOSURE

1. Field of the Disclosure

The present disclosure relates to a vertical external cavity surface emitting laser (VECSEL) and a display apparatus employing the same, and more particularly, to a VECSEL having an improved mirror that forms an external cavity to modulate an emitted laser beam and a display apparatus employing the same.

2. Description of the Related Art

VECSELs increase a gain region by adopting an external mirror instead of an upper mirror for a Vertical Cavity Surface Emitting Laser (VCSEL) and obtain a high output power of several to several tens of watts (W) or higher.

FIG. 1 is a schematic diagram illustrating the optical arrangement of a conventional end-pumped VECSEL. Referring to FIG. 1, the conventional VECSEL includes a pumping unit providing a pump beam, a laser chip 11 that is excited by a pump beam to emit a laser beam, and first and second mirrors 17 and 19 that are located outside the laser chip 11 and form an external cavity. The pumping unit includes a pumping light source 1 and a collimating lens 5 collimating a pump beam emitted by the pumping light source 1 and provides a pump beam to a portion of the laser chip from which a laser beam is emitted.

A heat sink 13 is disposed on one surface of the laser chip 11 and dissipates heat generated by the laser chip 11.

The first mirror 17 is separated from the laser chip 11 and is obliquely disposed relative to an axis of incident light emitted by the laser chip 11. The first mirror 17 has a concave reflecting surface 17a facing the laser chip 11 and the second mirror 19. Thus, the first mirror 17 prevents a laser beam resonating between the second mirror 19 and the laser chip 11 from diverging. The second mirror 19 faces the first mirror 17 and reflects light from the first mirror 17 back into the first mirror 17.

A birefrigent filter 15 is disposed between the first mirror 17 and the laser chip 11 and filters out all but a laser beam having a predetermined wavelength. A Second Harmonic Generation (SHG) crystal 21 is disposed between the first and second mirrors 17 and 19 and converts the laser beam emitted by the laser chip 11 to its half wavelength beam.

The conventional VECSEL having the above-mentioned configuration does not have a built-in modulator for modulating laser output power. Thus, the conventional VECSEL requires an external light modulator, such as an acoustic light modulator, that controls laser output power corresponding to an image to be projected or a color wheel when it is used as a scanning light source for each color in a laser display apparatus.

SUMMARY OF THE DISCLOSURE

The present invention may provide a vertical external cavity surface emitting laser (VECSEL) having an improved mirror that forms an external cavity and can modulate laser output power and a display apparatus employing the VECSEL.

According to an aspect of the present invention, there may be provided a VECSEL including: a laser chip that is excited by a pump beam emitted by the pumping light source to emit a laser beam of a predetermined wavelength; a folding mirror that is separated from the laser chip and is obliquely disposed relative to an axis of incident light emitted by the laser chip and converts the propagation path of an incident laser beam; a movable mirror unit facing the folding mirror that rotates so as to selectively reflect a laser beam reflected from the folding mirror to the folding mirror.

The VECSEL further includes: an SHG (Second Harmonic Generation) crystal that is disposed in an optical path between the folding mirror and the movable mirror unit and converts a laser beam emitted by the laser chip into its half wavelength beam, a birefrigent filter that is disposed in an optical path between the laser chip and the folding mirror and filters out all but a laser beam of a predetermined wavelength; and a heat sink that is attached to one surface of the laser chip and dissipates heat away from the laser chip.

According to another aspect of the present invention, there may be provided a laser display apparatus displaying an image by scanning a laser beam onto a screen, which includes: the VECSEL having the above-mentioned structure that emits a modulated laser beam; a light scanning unit scanning light emitted by the VECSEL to create a planar image onto the screen; and a projection optical system that is disposed between the VECSEL and the screen and enlarges and projects a laser beam onto the screen.

BRIEF DESCRIPTION OF THE DRAWINGS

The above and other features and advantages of the present invention will be illustrated in detailed exemplary embodiments thereof with reference to the attached drawings in which.

DETAILED DESCRIPTION OF EXEMPLARY EMBODIMENTS

Figure 1:
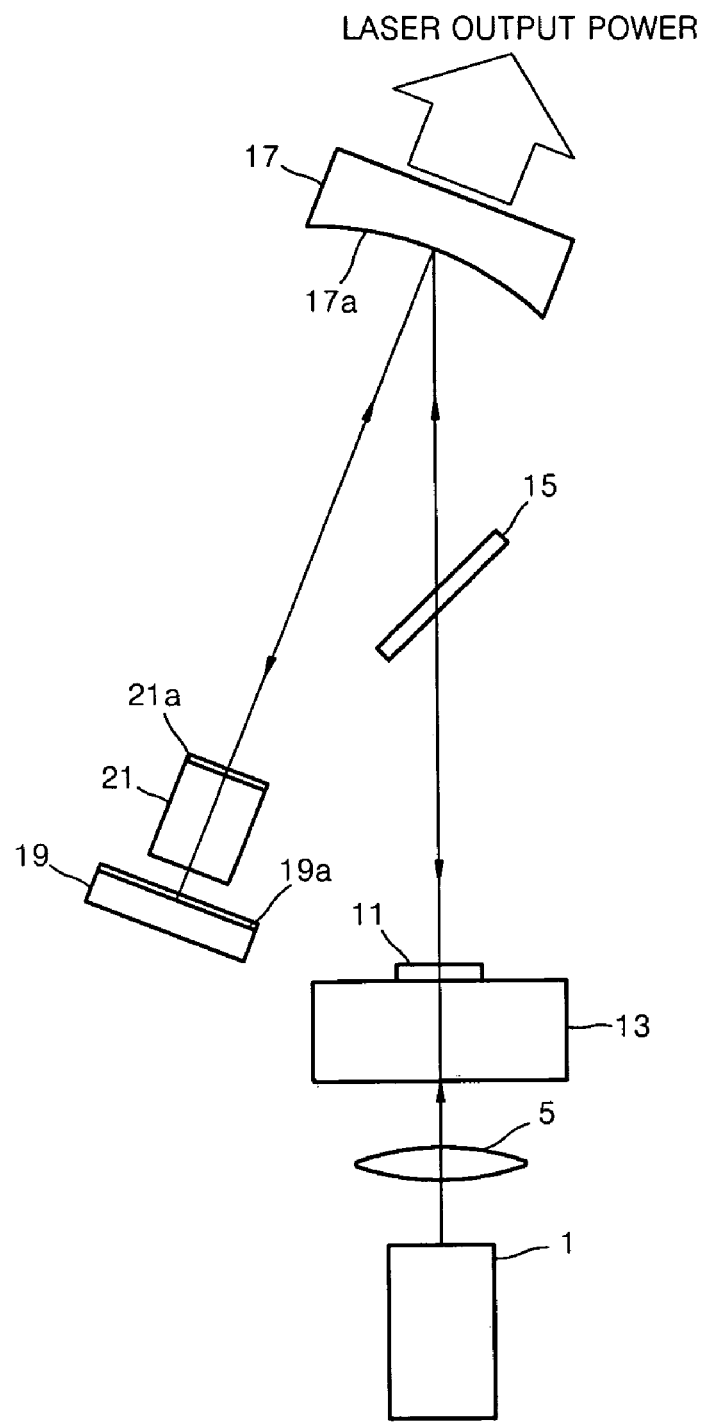
FIG. 1 is a schematic diagram illustrating the optical arrangement of a conventional vertical external cavity surface emitting laser (VECSEL)
Figure 2:
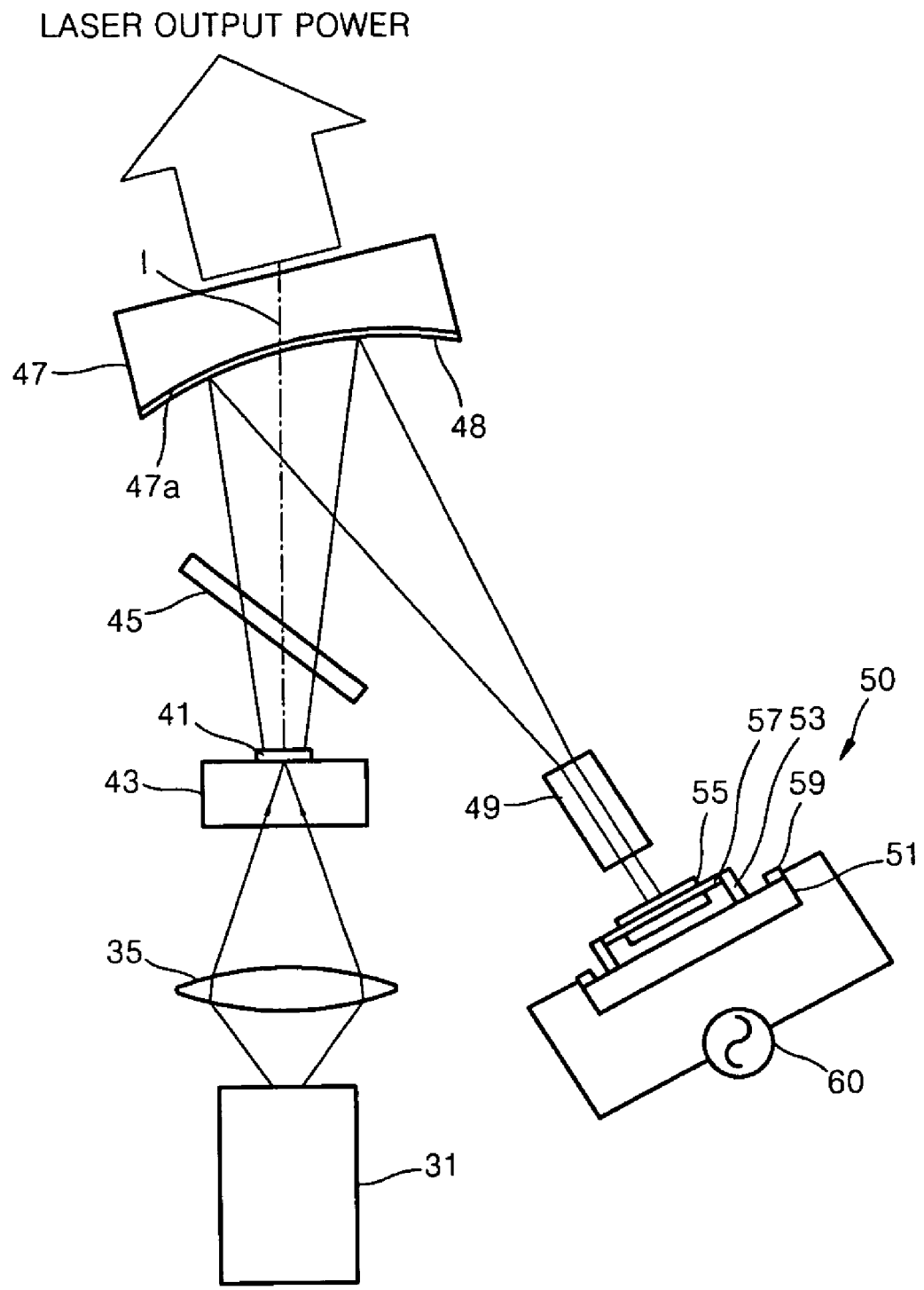
FIG. 2 is a schematic diagram illustrating the optical arrangement of a VECSEL having a modulating mirror according to an embodiment of the present invention.

A vertical external cavity surface emitting laser (VECSEL) having a modulating mirror and a display apparatus employing the VECSEL according to preferred embodiments of the present invention will now be described more fully with reference to the accompanying drawings. FIG. 2 is a schematic diagram illustrating the optical arrangement of a VECSEL having a modulating mirror according to an embodiment of the present invention and FIG. 3 is a schematic perspective view of the movable mirror unit.

Figure 3:
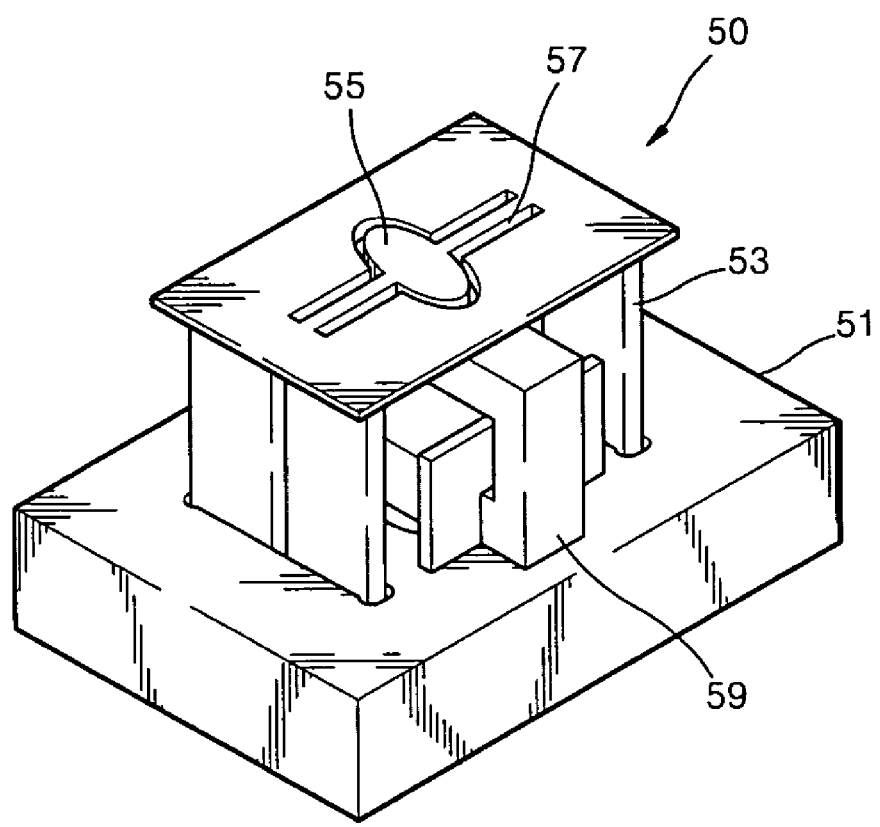
FIG. 3 is a schematic perspective view of the movable mirror unit shown in FIG. 2.

Referring to FIGS. 2 and 3, the VECSEL includes a pumping light source 31, a laser chip 41 that is excited by a pump beam emitted by the pumping light source 31 to emit a laser beam of a predetermined wavelength, and a folding mirror 47 and a movable mirror unit 50 that cooperates with the laser chip 41 to form a cavity. The pumping light source 31 is disposed on or behind a surface of the laser chip 41 from which a laser beam is emitted and provides a pump beam to the laser chip 41. The VECSEL further includes a collimating lens 35 that is disposed between the pumping light source 31 and the laser chip 41 and collimates a pump beam emitted by the pumping light source 31. The laser chip 41 includes an active layer that is excited by the pump beam to emit light of a predetermined wavelength and a distributed Bragg reflector (DBR) layer. The DBR layer is a mirror layer that reflects a laser beam generated in the active layer toward the movable mirror unit 50 so that the laser beam resonates between the DBR layer and the movable mirror unit 50.

A heat sink 43 is attached to one surface of the laser chip 41 and dissipates heat away from the laser chip 41. When the pumping light source 31 is disposed behind a surface of laser chip 41 from which a laser beam is emitted, the heat sink 43 is made of a transparent material that can transmit a pump beam emitted by the pumping light source 31 or may have an opening (not shown) through which the pump beam passes.

The folding mirror 47 converts the propagation path of an incident laser beam and is separated from the laser chip 41 and is obliquely disposed relative to an axis I of incident light emitted by the laser chip 41. That is, light incident from the laser chip 41 is reflected toward the movable mirror unit 50 and most of light incident from the movable mirror unit 50 is reflected toward the laser chip 41. The folding mirror 47 transmits light of a predetermined wavelength that meets a predetermined condition so that a laser beam is emitted.

The folding mirror 47 has a concave reflecting surface 47a facing the laser chip 41 and prevents most of laser light resonating between the laser chip 41 and the movable mirror unit 50 from diverging between the laser chip 41 and the movable mirror unit 50.

The folding mirror 47 further includes a wavelength filter 48 that is disposed on the concave reflecting surface 47a and has reflectance and transmittance that varies depending on the wavelength of the incident light. For example, the wavelength filter 48 reflects laser light of a predetermined wavelength emitted by the laser chip 41 and transmits at least a portion of laser light wavelength converted by a Second Harmonic Generation (SHG) crystal 49 that will be later described. In a preferred embodiment a wavelength filter disposed on one surface of the folding mirror facing the laser chip reflects most of the beam of the same predetermined wavelength as that of the laser beam emitted by the laser chip and transmits most of the laser beam wavelength converted by the SHG crystal.

The movable mirror unit 50 faces the concave reflecting surface 47a. The movable mirror unit 50 forms an external cavity with the folding mirror 47 and modulates a laser beam that has passed through the folding mirror 47. To achieve this function, the movable mirror unit 50 includes a base 51, a movable mirror 55 rotatably mounted on the base 51, and an actuator 59 that is disposed on the base 51 that reciprocatingly rotates the movable mirror 55. The movable mirror 55 is separated from the base 51 by a post 53 and is mounted rotatably on a hinge 57 disposed between the post 53 and the movable mirror 55.

The actuator 59 reciprocatingly rotates the movable mirror 55 due to a driving force provided by piezoelectric actuation, electrostatic capacity actuation, or electromagnetic actuation. That is, the actuator 59 drives the movable mirror 55 to an operative state as shown in FIGS. 4A and 4B depending on whether power is supplied through a power supply 60.

Figure 4A:
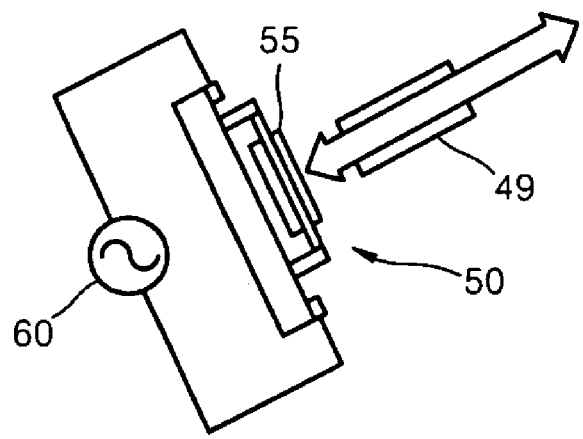
FIGS. 4A and 4B illustrate the operation states of the movable mirror unit shown in FIG. 2.
Figure 4B:
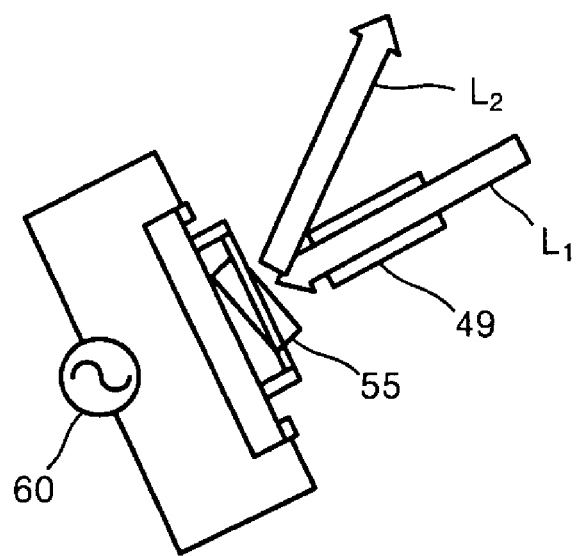

FIG. 4A illustrates the on-state of the movable mirror unit 50. When the movable mirror 55 is disposed in a fashion shown in FIG. 4A, a cavity structure is formed between the laser chip (41 of FIG. 2) and the movable mirror 55 to normally emit a laser beam. FIG. 4B illustrates the off-state of the movable mirror unit 50. When the movable mirror 55 is mislocated as shown in FIG. 4B, beam $L_1$ incident from the laser chip (41 of FIG. 2) propagates along a different path indicated by $L_2$ as it is reflected by the movable mirror 55. Thus, the VECSEL according to the current embodiment does not emit a laser beam when it is in an off state. As described above, the output of a laser beam can be controlled depending on the operation state of the movable mirror 55 by replacing an external cavity mirror with the movable mirror unit 50. The VECSEL can produce a modulated laser beam that can be modulated without an additional external modulator. Referring FIG. 2, the VECSEL further includes the SHG crystal 49 and a birefrigent filter 45. The SHG crystal 49 is disposed in an optical path between the folding mirror 47 and the movable mirror unit 50 and converts a laser beam emitted by the laser chip 41 into its half wavelength beam. For example, when laser light emitted by the laser chip 41 has a wavelength of 1,064 nm, laser light converted by the SHG crystal 49 has a wavelength of 532 nm.

The birefrigent filter 45 is disposed in an optical path between the laser chip 41 and the folding mirror 47 and filters out all but laser light of a predetermined wavelength so that the filtered laser light can resonate.

Figure 5:
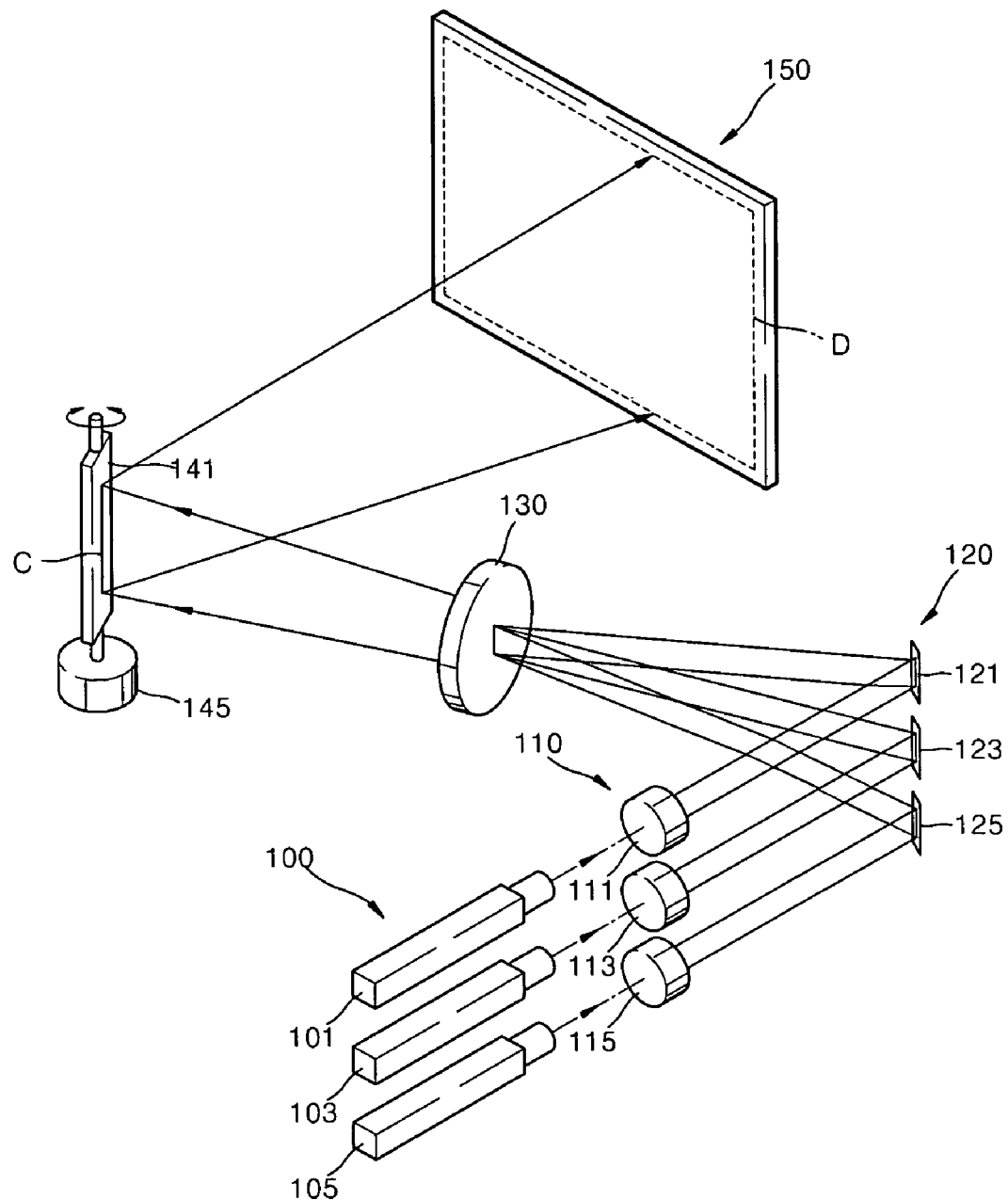
FIG. 5 is a schematic diagram illustrating the optical arrangement of a display apparatus employing a VECSEL according to an embodiment of the present invention.

FIG. 5 is a schematic diagram illustrating the optical arrangement of a laser display apparatus employing a VECSEL according to an embodiment of the present invention. Referring to FIG. 5, the laser display apparatus for displaying an image by scanning a laser beam onto a screen 150 includes a VECSEL 100 emitting a modulated laser beam, a light scanning unit, and a projection optical system 130 that is disposed between the VECSEL 100 and the screen 150 and enlarges and projects light onto the screen 150.

The VECSEL 100 having a structure that allows modulation as described with reference to FIGS. 2-4B emits a laser beam corresponding to an image to be projected onto the screen 150. In this case, the VECSEL 100 includes first through third VECSELs 101, 103, and 105 emitting red, blue, and green laser beams in order to realize a color display. The first through third VECSELs 101, 103, and 105 may be arranged in a different order. While it is described above that the first through third VECSELs 101, 103, and 105 emit red, blue, and green laser beams, they emit light of different wavelengths or VECSEL 100 may consist of two or at least four VECSELs.

The light scanning unit scans light emitted by the VECSEL 100 to create a planar image onto the screen 150. To achieve this function, the light scanning unit includes a cylindrical lens unit 110, a linear reflective panel 120, and a scanning mirror 141. The cylindrical lens unit 110 shapes incident light emitted by the VECSEL 100 into light having a linear cross-sectional shape. Referring to FIG. 5, when the first through third VECSELs 101, 103, and 105 are used as a light source, the cylindrical lens unit 110 includes first through third cylindrical lenses 111, 113, and 115 that are disposed in paths along which laser beams emitted by the first through third VECSELs 101, 103, and 105 propagate and shape the beams into a desired shape.

The linear reflective panel 120 is disposed between the cylindrical lens unit 110 and the scanning mirror 141 and reflects the incident linearly-shaped light independently for each pixel to create a linear image. To this end, the linear reflective display 120 may be arranged in a line along which linear light is incident and has multiple digital micro-mirror devices (DMDs), each corresponding to one pixel of a linear image.

As shown in FIG. 5, when the first through third VECSELs 101, 103, and 105 are used as a light source, the linear reflective panel 120 includes first through third reflective panels 121, 123, and 125 disposed in paths along which beams shaped by the first through third cylindrical lenses 111, 113, and 115 propagate.

The scanning mirror 141 reciprocatingly rotates due to a driving force provided by a driving source 145 and performs a vertical line scan on the linear image C created by the linear reflective panel 120 to create a planar image D on the screen 150.

The projection optical system 130 is disposed between the VECSEL 100 and the screen 150 and enlarges and projects a laser beam onto the screen 150. The display apparatus uses the VECSEL 100 having a modulating mirror to allow modulation of a laser beam output, thus providing a full-color image without using a separate color wheel.

Figure 6:
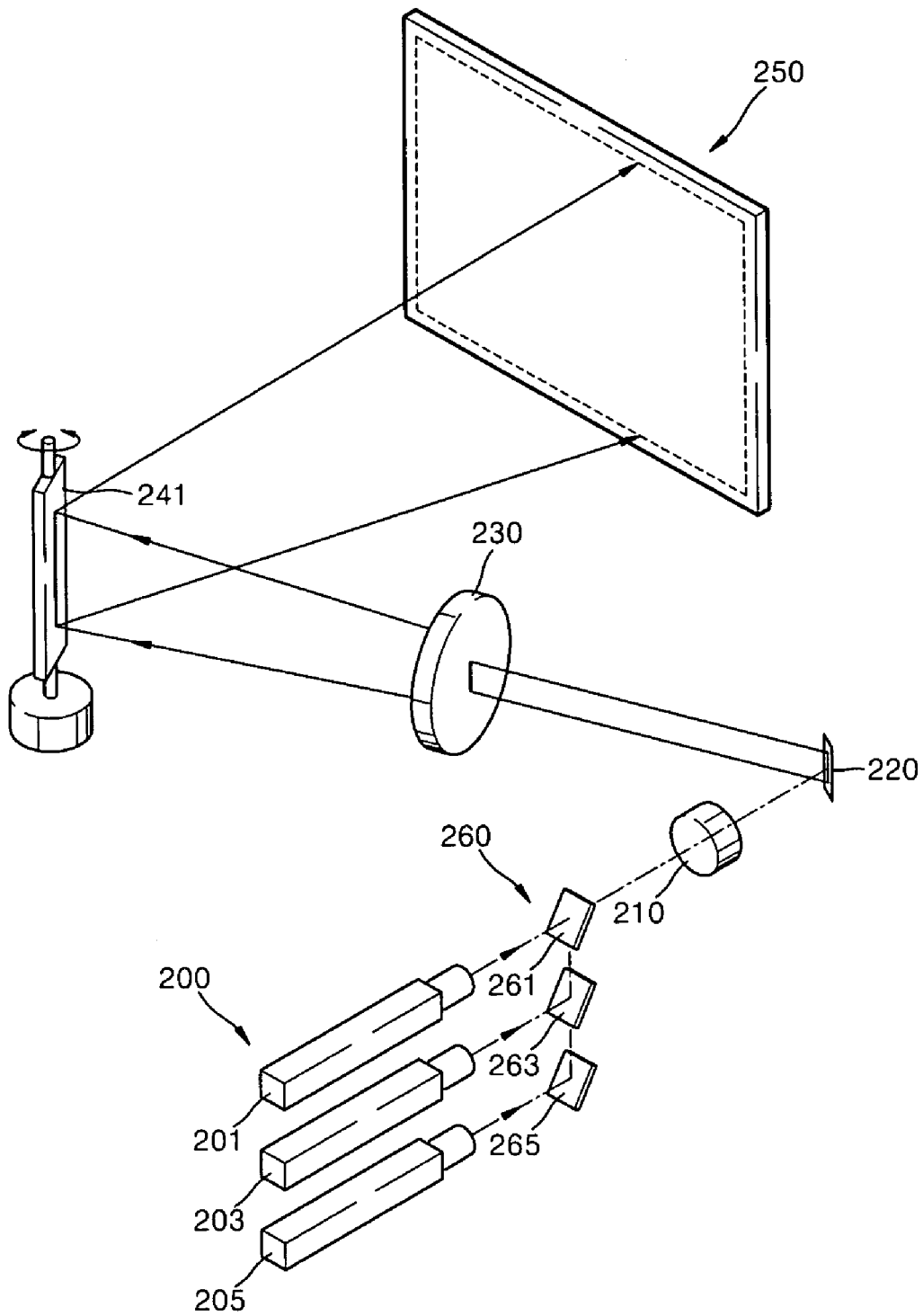
FIG. 6 is a schematic diagram illustrating the optical arrangement of a display apparatus employing a VECSEL according to another embodiment of the present invention.

FIG. 6 is a schematic diagram illustrating the optical arrangement of a laser display apparatus employing a VECSEL according to another embodiment of the present invention. Referring to FIG. 6, the laser display apparatus according to the present embodiment for displaying an image by scanning a laser beam onto a screen 250 includes a VECSEL 200 emitting a modulated laser beam, a light scanning unit, and a projection optical system 230 that is disposed between the VECSEL 200 and the screen 250 and enlarges and projects light onto the screen 250.

The VECSEL 200 having a structure that allows modulation as described above emits a laser beam corresponding to an image to be projected onto the screen 250. In this case, the VECSEL 200 includes first through third VECSELs 201, 203, and 205 emitting red, blue, and green laser beams in order to realize a color display. The first through third VECSELs 201, 203, and 205 may be arranged in a different order. Because the VECSEL 200 has substantially the same construction as the VECSEL 100, a detailed explanation thereof is being omitted.

The light scanning unit scans light emitted by the VECSEL 200 to create a planar image onto the screen 250. To achieve this function, the light scanning unit includes a cylindrical lens 210, a linear reflective panel 220, and a scanning mirror 241. The cylindrical lens 210 shapes incident light emitted by the VECSEL 200 into light having a linear cross-sectional shape. The linear reflective panel 220 is disposed between the cylindrical lens 210 and the scanning mirror 241 and reflects the incident linearly-shaped light independently for each pixel to create a linear image.

Unlike the cylindrical lens (110 of FIG. 5) and the linear reflective panel (120 of FIG. 5), the cylindrical lens 210 and the linear reflective panel 220 have a single component. The display apparatus according to the present embodiment further includes a light path converting unit 260 guiding the laser beams emitted by the first through third VECSELs 201, 203, and 205 so that they propagate along the same path. The light path converting unit 260 is disposed between the cylindrical lens 210 and the first through third VECSELs 201, 203, and 205 and includes first and second beam splitters 261 and 263 and a single reflective mirror 265.

The first beam splitter 261 transmits a laser beam of a predetermined wavelength emitted by the first VECSEL 201, e.g., a red laser beam, while reflecting laser beams of predetermined wavelengths emitted by the second and third VECSELs 203 and 205, e.g., blue and green laser beams. Thus, the first beam splitter 261 directs all the laser beams emitted by the first through third VECSELs 201, 203, and 205 toward the cylindrical lens 210.

The second beam splitter 263 reflects a laser beam of a predetermined wavelength emitted by the second VECSEL 203, e.g., a blue laser beam, while reflecting a laser beam of predetermined wavelength emitted by the third VECSEL 205, e.g., a green laser beam. Thus, the second beam splitter 263 directs the laser beams emitted by the second and third VECSELs 203 and 205 toward the first beam splitter 210.

The reflective mirror 265 is disposed between the third VECSEL 205 and the second beam splitter 263 and reflects a laser beam of a predetermined wavelength emitted by the third VECSEL 205, e.g., a green laser beam, toward the second beam splitter 265.

The first and second beam splitters 261 and 263 and the reflective mirror 265 in the light path converting unit 260 may have different functions and be arranged in various other ways. For example, the light path converting unit 260 may combine laser beams emitted by the first through third VECSELs 201, 203, and 205 together and direct the resulting beam toward the cylindrical lens 210.

Since the projection optical system 230 and the scanning mirror 245 have substantially the same functions and configurations as their counterparts in the display apparatus according to the embodiment illustrated in FIG. 5, a detailed description thereof is being omitted.

As described above, the display apparatus according to the present embodiment uses the VECSEL 200 having a modulating mirror to allow modulation of the laser beam output, thus achieving a full-color image without using a separate color wheel. The display apparatus also includes the light path converting unit to allow propagation of laser beams emitted by the VECSEL 200 along a single path, thus achieving a full-color image and a compact size through the use of the single cylindrical lens 210 and the linear reflective panel 220.

As described above, because a VECSEL according to the present invention uses a movable mirror unit as an external cavity to provide a modulated laser output, it can be widely used in applications requiring light modulation without using a separate light modulator or a color wheel. A display apparatus employing a VECSEL having a modulating mirror according to the present invention can provide a full color image laser output power corresponding to an image to be projected without using a separate light modulator or a color wheel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A VECSEL (Vertical External Cavity Surface Emitting Laser) comprising:
   a pumping light source;
   a laser chip including an active layer that is excited by a pump beam emitted by the pumping light source to emit a laser beam of a predetermined wavelength;
   a folding mirror that is separated from the laser chip and is obliquely disposed relative to an axis of incident light emitted by the laser chip and changes the propagation path of an incident laser beam; and a movable mirror unit facing the folding mirror that rotates so as to modulate a laser beam by selectively reflecting a laser beam reflected from the folding mirror to the folding mirror.

2. The VECSEL of claim 1, wherein the moving mirror unit comprises:
a base;
a movable mirror rotatably mounted on the base; and
an actuator that is disposed on the base and rotates the movable mirror.

3. The VECSEL of claim 2, wherein the actuator rotates the movable mirror due to a driving force provided by piezoelectric actuation, electrostatic capacity actuation, or electromagnetic actuation.

4. The VECSEL of claim 1, further comprising an SHG (Second Harmonic Generation) crystal that is disposed in an optical path between the folding mirror and the movable mirror unit and converts a laser beam emitted by the laser chip into its half wavelength beam.

5. The VECSEL of claim 4, further comprising:
a birefrigent filter that is disposed in an optical path between the laser chip and the folding mirror and filters out only a laser beam of a predetermined wavelength; and
a heat sink that is attached to one surface of the laser chip and dissipates heat away from the laser chip.

6. The VECSEL of claim 4, further comprising a wavelength filter that is disposed on one surface of the folding mirror facing the laser chip and reflects most of laser beam of the same predetermined wavelength as that of a laser beam emitted by the laser chip and transmits most of laser beam wavelength converted by the SHG crystal.

7. A laser display apparatus displaying an image by scanning a laser beam onto a screen, the apparatus comprising:
the VECSEL of claim 1 emitting a modulated laser beam;
a light scanning unit scanning light emitted by the VECSEL to create a planar image onto the screen; and
a projection optical system that is disposed between the VECSEL and the screen and enlarges and projects a laser beam onto the screen.

8. The apparatus of claim 7, wherein the light scanning unit comprises:
a cylindrical lens shaping incident light emitted by the VECSEL into light having a linear cross-sectional shape;
a linear reflective panel reflecting the incident linear light independently for each pixel to create a linear image; and
a scanning mirror scanning the linear image created by the linear reflective panel to create a planar image on the screen.

9. The apparatus of claim 8, wherein the VECSEL includes first through third VECSELs emitting red, blue, and green laser beams,
wherein the cylindrical lens includes first through third cylindrical lenses disposed in paths along which red, blue, and green laser beams propagate, and
wherein the linear reflective panel includes first through third linear reflective panels disposed in paths along which beams shaped by the first through third cylindrical lenses propagate, thus achieving a full-color image.

10. The apparatus of claim 8, wherein the cylindrical lens and the linear reflective panel respectively have a single component, and
wherein the VECSEL includes first through third VECSELs emitting red, blue, and green laser beams, and
further comprising a light path converting unit that is disposed between the first through third VECSELs and the cylindrical lens and guides laser beams emitted by the first through third VECSELs so that they propagate along the same path.

11. The apparatus of claim 7, wherein the VECSEL further includes an SHG (Second Harmonic Generation) crystal that is disposed in an optical path between the folding mirror and the movable mirror unit and converts a laser beam emitted by the laser chip into its half wavelength beam.

12. The apparatus of claim 11, wherein the VECSEL further includes:
a birefrigent filter that is disposed in an optical path between the laser chip and the folding mirror and filters out only a laser beam of a predetermined wavelength; and
a heat sink that is attached to one surface of the laser chip and dissipates heat away from the laser chip.

13. The apparatus of claim 11, wherein the VECSEL further includes a wavelength filter that is disposed on one surface of the folding mirror facing the laser chip and reflects most of laser beam of the same predetermined wavelength as that of a laser beam emitted by the laser chip and transmits most of laser beam wavelength converted by the SHG crystal.

* * * * *